United States Patent [19]

Targoff

[11] Patent Number: 5,661,487
[45] Date of Patent: Aug. 26, 1997

[54] DIGITAL CENTER LINE FILTER

[75] Inventor: Donald M. Targoff, Tucson, Ariz.

[73] Assignee: Hughes Missile Systems Company, Los Angeles, Calif.

[21] Appl. No.: 578,800

[22] Filed: Dec. 26, 1995

[51] Int. Cl.$^6$ ..................................... G01V 13/00
[52] U.S. Cl. .................. 342/101; 342/159; 342/195
[58] Field of Search .................... 342/89, 98, 101, 342/159, 160, 162, 195; 364/724.01, 724.06, 724.1

[56] References Cited

U.S. PATENT DOCUMENTS

| | | | |
|---|---|---|---|
| 3,787,851 | 1/1974 | Hughes | 342/161 |
| 4,809,203 | 2/1989 | Wilson et al. | 364/602 |
| 5,168,459 | 12/1992 | Hiller | 364/724.19 |
| 5,325,318 | 6/1994 | Harris et al. | 364/724.1 |
| 5,390,536 | 2/1995 | Zhang et al. | 73/105 |

OTHER PUBLICATIONS

Tattersall et al., "Digital Bandlimiting Filters for PCM Transmission Systems", IEEE Trans. on Comm., vol. COM-27, No. 1, pp. 240-246 Jan. 1979.

*Primary Examiner*—Ian J. Lobo
*Attorney, Agent, or Firm*—Charles D. Brown; Wanda K. Denson-Low

[57] ABSTRACT

A center-line filter for a radar receiver is a cascade of an analog filter and a digital filter. The purpose of the filter cascade is to filter out all but a single line of a pulsed spectrum. The signal is passed through the analog filter, and then over-sampled. A sharp cutoff FIR filter is used to eliminate the remaining undesired lines. Since the analog filter already has the correct matched filter characteristic in the passband, the digital filter passband is deliberately wider and unsymmetrical. After digital filtering, the filter output is decimated to provide a desired output data rate.

19 Claims, 4 Drawing Sheets

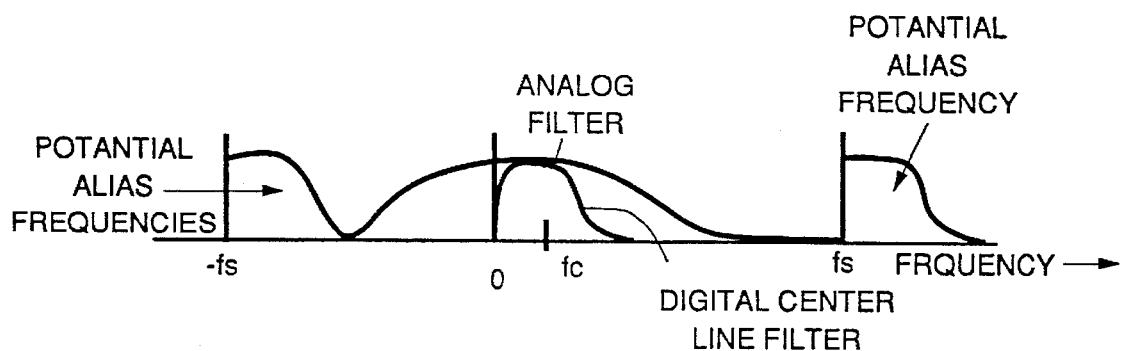
FIG. 2.
FIG. 3a.
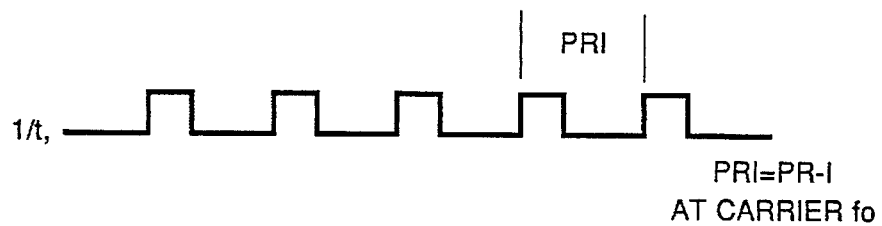
PRI=PR-I AT CARRIER fo
FIG. 3b.
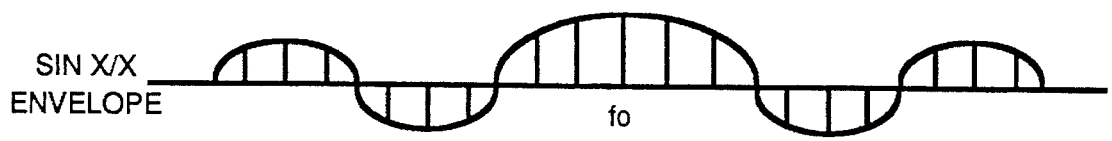

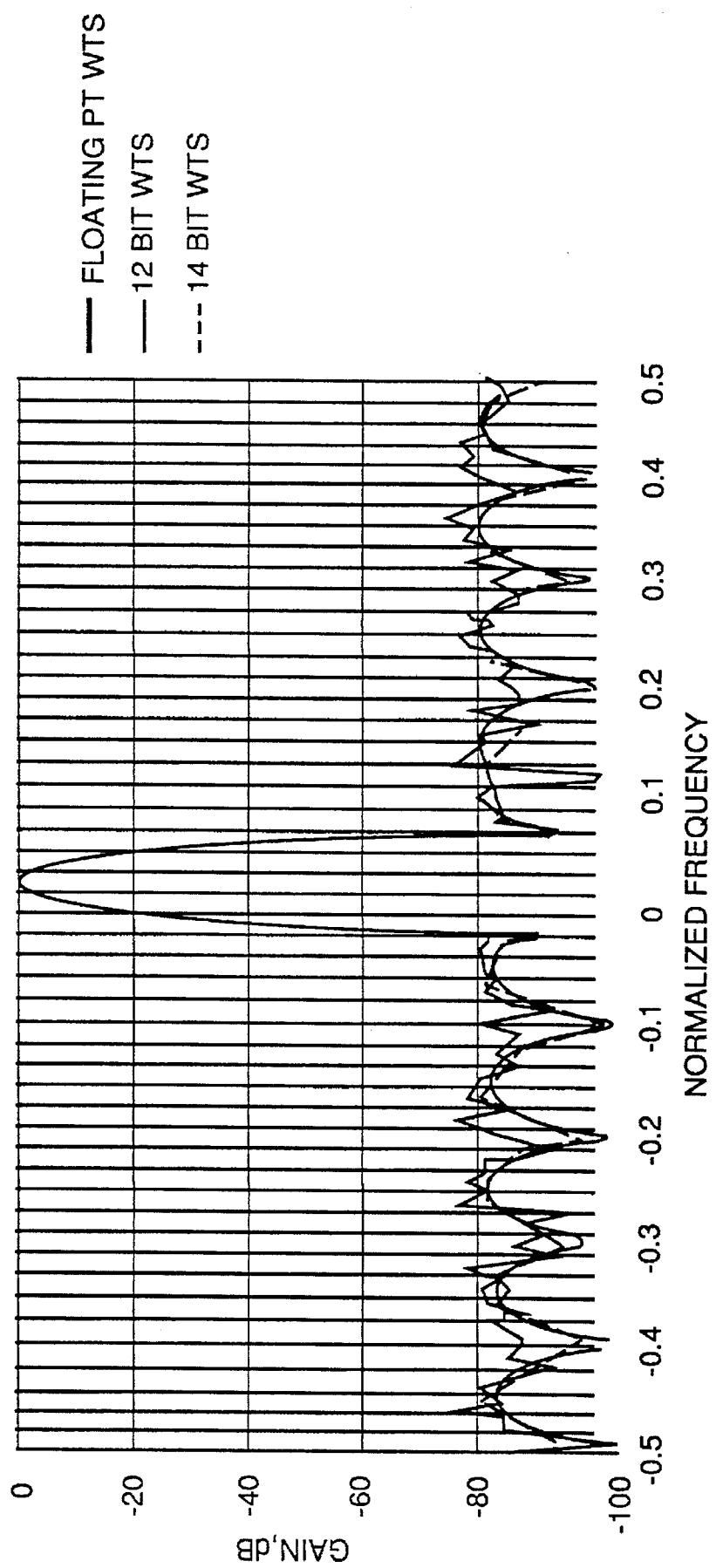

5,661,487

DIGITAL CENTER LINE FILTER

TECHNICAL FIELD OF THE INVENTION

This invention relates to radar receivers, and more particularly to a center-line filter which includes a baseband analog filter combined with a digital filter.

BACKGROUND OF THE INVENTION

This invention has particular utility in a radar receiver carried on board an air-to-air missile. Analog center-line filters are conventionally used in the receiver, which has several channels, each requiring a center-line filter. The center-line filters must be nearly identical in performance. Digital sampling at frequency $f_s$ of continuous signals results in the digital data values being the same for harmonics of $f_s$. For example, one cannot tell the difference between $0.9 f_s$, $1.9 f_s$, $2.9 f_s$, $3.9 f_s$, and so on. This is called aliasing, or folding, or ambiguity of the spectrum. The problem occurs in two typical signal or multi-tone cases, when a high frequency interfering signal folds (or aliases) back into the spectrum near or on the desired signal. An anti-aliasing filter eliminates the potential aliasing frequencies before digital sampling. Then the user knows the true frequency of the signal. A classical center line filter is like a super anti-aliasing filter because it only passes a very narrow region of frequencies of interest. Therefore, after digital sampling, there is no spectral aliasing.

Space (size) considerations constrain the design of analog filters, and the slow roll-off of analog filters make this type of filter unacceptable as an anti-aliasing filter. Moreover, analog filters are relatively expensive. Conventional analog center-line filters operate at base band, and moving the frequency band to higher IF would be difficult as the Q of the filter may be too high. Further, it is difficult to achieve channel matching requirements due to frequency drift.

SUMMARY OF THE INVENTION

A center-line filter apparatus is described for filtering out all but a single line at $f_c$ of the frequency spectrum of a pulsed signal characterized by a pulse repetition frequency (PRF). The center-line filter apparatus includes a baseband analog filter having a noise bandwidth characteristic matched to the PRF for filtering the pulsed signal to provide an analog filter signal. An analog-to-digital convertor is responsive to the analog filter signal for converting the analog filter signal to a digital convertor signal, the convertor sampling the analog filter signal at a high rate in comparison to the PRF, e.g. on the order of 30 to 1. A digital filter processes the digital convertor signals, and includes weighting means for applying complex weights (i.e., having a real part and an imaginary part) to the digital convertor signals. The analog filter and digital filter act in combination to provide a filter having a composite filter response characteristic which provides a narrow passband centered at $f_c$.

In accordance with a further aspect of the invention, the filter apparatus includes a decimation processor for decimating the output of the digital filter by a predetermined factor. This factor can be equal to an integer value which is the multiple of the PRF at which the analog-to-digital convertor is sampled.

BRIEF DESCRIPTION OF THE DRAWING

These and other features and advantages of the present invention will become more apparent from the following detailed description of an exemplary embodiment thereof, as illustrated in the accompanying drawings, in which:

FIG. 2 illustrates the frequency response of the analog-filter of the radar receiver and its relationship to the potential aliasing frequencies resulting from the digital sampling process.

FIG. 3a illustrates an exemplary signal pulse train. FIG. 3b illustrates the sinx/x envelope of the pulse train spectrum about the carrier fundamental frequency.

FIG. 5 shows exemplary FIR filter responses as a function of frequency normalized to 3.6 MHz.

DETAILED DESCRIPTION OF THE PREFERRED EMBODIMENT

Figure 1:
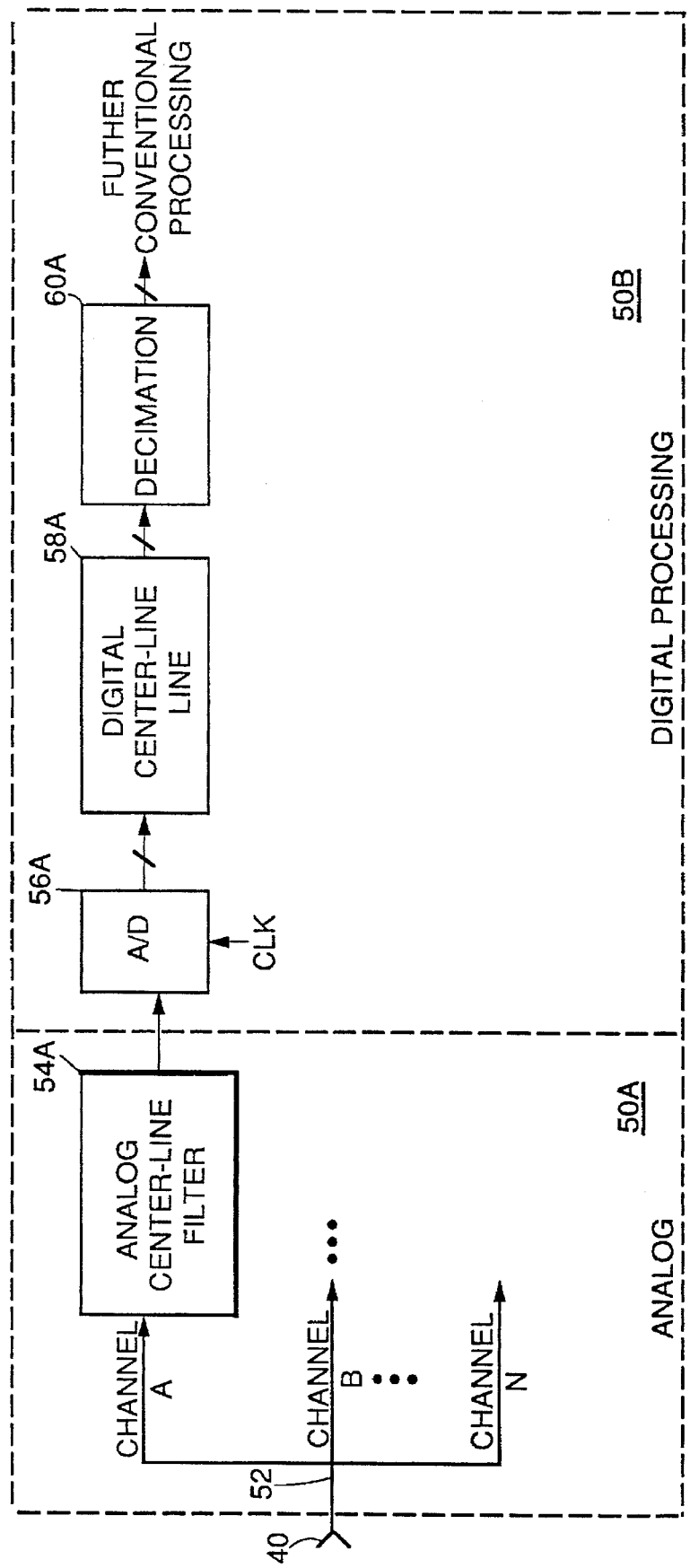
FIG. 1 is a simplified block diagram of a radar receiver embodying the invention.

FIG. 1 is a simplified schematic block diagram of a radar receiver 50 embodying the invention. The radar system includes an antenna 40 which feeds received signals in analog form to the receiver analog section 50A. In this exemplary embodiment, the receiver has multiple channels, and includes a power divider 52 which divides and distributes the received signal to N channels, only one of which (channel A) is shown in FIG. 1 in each channel, a base-band analog center-line filter, e.g. filter 54A, filters the received signal. As is well known in the art, baseband is the base or true frequency of the information signals. At a radio-transmitter, signals are mixed (or multiplied) up and modulated on a high frequency carrier for transmission. On receive, the signals are demodulated in frequency back to base band. For this exemplary application, the analog filter needs to be at base band because of the high frequency of the signal content. Present analog-to-digital conversion technology limits application from higher pass bands. In general, however, the invention can be employed with a digital filter following a band pass (versus base band or low pass) filter with a sufficiently fast analog-to-digital convertor.

After filtering by the analog filter 54A, the analog signal is converted to digital form by A/D convertor 56A, and passed to the digital processing section 50B of the receiver 50. The digitized signal is then passed through a digital center-line filter 58A and then decimated by decimation processing 60A. The decimated output of the digital filter is passed to further conventional receiver processing. In an exemplary embodiment, the digital filter 58A is a Finite Impulse Response (FIR) filter.

Typically, the received signal at antenna 40 is the active radar return, and will be a pulse train at the transmitter pulse repetition frequency or rate (PRF).

A conventional radar receiver samples the incoming pulse train at the PRF or sometimes at twice the PRF, after the pulse train has passed through the analog center-line filter. The sampling of the incoming pulse train can be performed at the PRF and using in-phase/quadrature (IQ) processing will alias at the PRF. Simpler systems with real math processing must sample at two times the PRF to achieve aliasing at the PRF. The trade off is that I/Q systems require two A/D converters per channel, versus only one A/D converter for real processing. While in an exemplary application, the present system in accordance with the invention uses I/Q processing, the invention does not depend on I/Q processing; such processing just impacts on the required A/D speed and number of A/D converters required.

In accordance with this invention, the received signal is sampled by A/D convertor 56A at a very high rate $f_s$, in an exemplary embodiment at a rate of approximately 30 times the PRF. The incoming signal sample frequency $f_s$ for the A/D converter is dictated by the attenuation of the analog filter which is eliminating unwanted high frequency signals to keep out aliasing after sampling, as illustrated in FIG. 2. The sampling frequency $f_s$ is chosen so that the analog filter 54A has eliminated signals at the center line filter $+f_s$ and $-f_s$. This is done ahead of sampling to eliminate the regions of potential aliasing. There are higher regions ($2f_s$, $3f_s$, etc.), but clearly the first harmonic at $f_s$ is the closest and most critical. This determines the minimum value of $f_s$. The selected $f_s$ is the lowest PRF harmonic (NXPRF) greater than $f_s$ minimum, in an exemplary embodiment. Making $f_s$ a PRF multiple greater than $f_s$ minimum is done for convenience in decimating the digital filter output back down to a desired PRF rate for further processing, which is typically not the same as the input signal train PRF. The PRF established for further processing could be the same as the input signal train PRF, but is usually different because the clock rate on the signal transmitter will be a different clock than that used in the receiver.

In this exemplary embodiment, the rate of clock CLK for the A/D convertor 56A is approximately 30 times the PRF of the input signal train. If the signal train PRF is 130 Khz, for example, the A/D sample rate will be about 3.75 MHz. At this high sample frequency, the analog filter roll-off combined with the sinx/x spectral attenuation is sufficient that aliasing is not a problem. Thus the conventional analog filter with noise bandwidth matched to the PRF is utilized as an anti-aliasing filter when combined with oversampling and subsequent digital filtering.

A matched filter maximizes signal-to-noise ratio of the input signal to the system. A pulse input of time duration t has a matching noise bandwidth proportional to 1/t, e.g. 1 μto 1 Mhz. Simply, a filter wider than the signal bandwidth allows in more noise than signal. A narrower filter cuts off both noise and signal. The matched filter does the best job possible.

The incoming signal passes through the analog filter 5A and is then sampled with convertor 56A, e.g. a 12 bit analog-to-digital (A/D) convertor, at approximately 3.75 MHz for a PRF of 130 KHz. The digital filter 58A is a sharp cutoff filter which eliminates all unwanted spectral lines. A pulse train has a spectrum of lines spaced at the PRF, that attenuate in a sinx/x envelope with a null at 1/t. The pulse train is shown in FIG. 3a. The sinx/x envelope with attenuated spectrum of lines is illustrated in FIG. 3b. The center line is the line at $f_c$ (the carrier fundamental). The other lines are not desired. The digital filter 58A passes only the center line while rejecting the other undesired lines.

Figure 4:
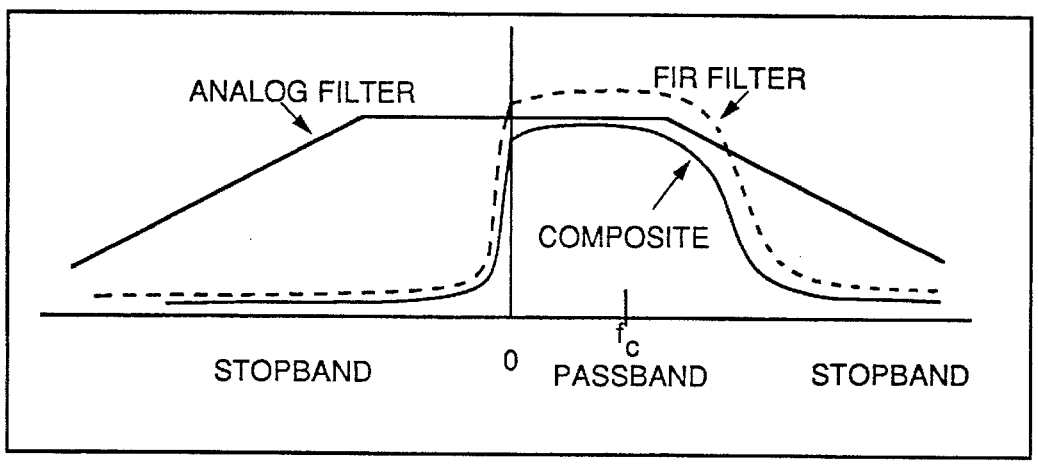
FIG. 4 illustrates the frequency responses respectively of the analog filter and digital FIR filter comprising the receive of FIG. 1, as well as their composite response.

FIG. 4 is a graph illustrating the frequency response of the analog center-line filter 54A, that of the FIR filter 58A, and the composite frequency response of the two filters 54A and 58A. It will be seen that the composite response, for the FIR digital filter employing complex FIR weights, produces a non-symmetric FIR passband, and non-symmetric composite passband as well. A filter passband is defined by a cut off frequency, usually the -3 dB points (one half power points) relative to the maximum in band (pass band) gain. However, in FIG. 4, the cut off frequency is shown as the break point. Since the analog filter 54A already has the correct matched filter characteristic in the passband, the digital filter passband upper cut off frequency is deliberately higher than that of the analog filter. The composite or cascaded filter passband is narrower than the passband of either the analog filter or the digital filter.

The FIR filter 58A output is then decimated, as indicated by the decimation function block 60, i.e. only every nth FIR filter output is used, so that the data rate into the next, conventional, processing stage of the receiver is identical to that of the conventional radar receiver with a conventional center-line analog filter. The decimation, while illustrated as a separate function carried out in the digital processing section 50B, can be carried out with the FIR function in the digital processing, as will be apparent to those skilled in the art.

A simulation was performed to demonstrate that a digital filter cascaded with the analog filter achieves the desired results. For the simulation, the response of the analog filter was reproduced in a digital simulation, and then several different digital filter models were tried. One digital filter model was a simple finite impulse response (FIR) filter of 90 points with decimation occurring at the output. The A/D 56A samples voltages that are continuous time varying signals (analog) and outputs a number at discrete points in time (digital). Each number out of the A/D converter is called a point. FIG. 5 shows the response of three 90 point FIR filters as a function of normalized frequency relative to 3.6 MHz, with the filters differing only in the number of bits in the weights. Thus, the responses of FIR filters having 12 bits defining the weights, 14 bits defining the weights, and a floating point (variable number of bits) weights are shown.

Figure 6:
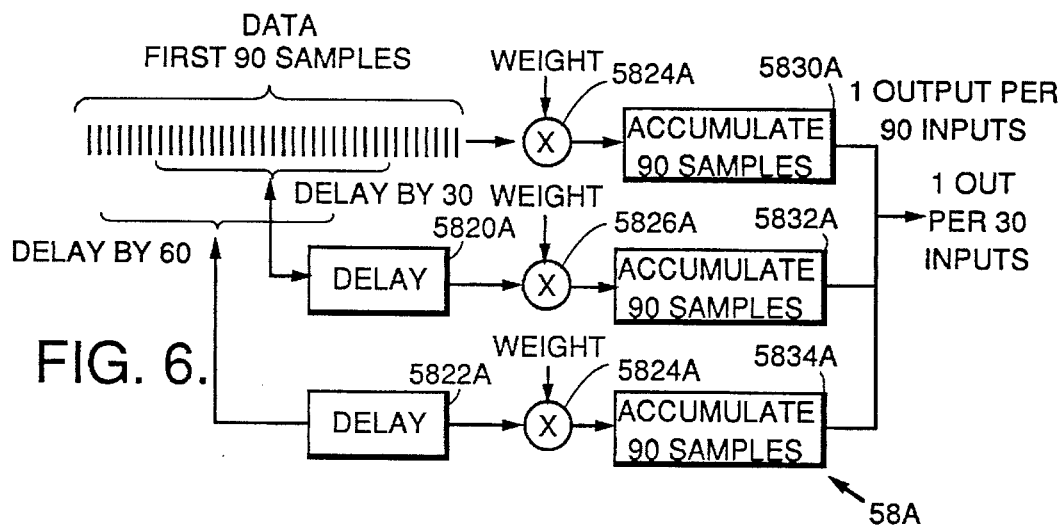
FIG. 6 is a simplified schematic block diagram of a single channel FIR filter comprising the receiver of FIG. 1, for an exemplary 90 point FIR filter with decimation by 30.

FIG. 6 is a simplified schematic diagram of an exemplary single channel FIR filter, the FIR having 90 points with decimation by 30. Three parallel FIRS 5824A, 5826A and 5828A are required in this example. In general, the number of FIR filters required, i.e. the minimum number, is the least integer greater than the number of points divided by the decimation factor. The FIR weights are complex values that shift the passband of the FIR filter as shown in FIG. 4. The design of the digital filter with complex weights allows analog video bandwidth asymmetries to be eliminated, which is not possible using analog filter designs.

FIG. 6 shows the first 90 data samples input into the FIR filter. The data samples are introduced without delay into the first filter 5824A, where the data samples are multiplied by the complex weight. A first delay 5820A is applied to a replica of the samples before the replica samples are introduced into the second FIR filter 5826A, delaying the samples by a time period equal to that needed to produce 30 samples, i.e. a 30 sample delay. A second delay 5822A is applied to another replica of the samples, this one of 60 sample duration, before the delayed samples are introduced into the third FIR filter 5828A. Each FIR applies a complex weight to each sample, so as to shift the pastband of the filter as shown in FIG. 4. Respective accumulators 5830A, 5832A and 5834A accumulate 90 samples of the respective FIR outputs. The decimation occurs at the output of each accumulator, in the sense that only one output per 90 samples is produced from each accumulator. Thus, with three FIRs, only 1 sample is produced from the digital center-line filter 58A for each 30 samples taken by the D/A convertor 56A. This is a sample data rate equivalent to that of conventional analog center-line filters and receivers, which employ sampling at the PRF. Since the D/A sample rate in this embodiment was at 30 times the PRF, and only one output sample is provided for each 30 input samples, the output data rate is equal to the PRF.

Figure 7:
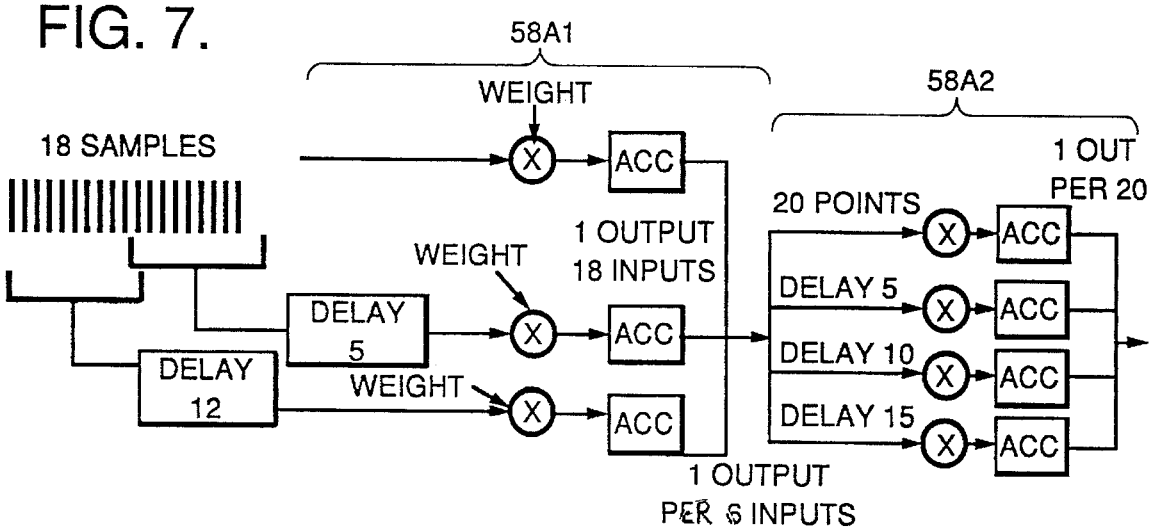
FIG. 7 is a block diagram of a digital filter embodiment comprising two cascaded FIR filters with decimation split-over the two stages.

FIG. 7 is a block diagram of a digital filter embodiment comprising two cascaded FIR filters 58A1 and 58A2, with the required decimation split over the two stages. The first FIR filter 58A1 is an 18 point filter decimated by 6, followed by a 20 point FIR filter 58A2 decimated by 5. The total decimation in this exemplary embodiment is 6×5=30.

It is understood that the above-described embodiments are merely illustrative of the possible specific embodiments which may represent application of the principles of the present invention. Other arrangements may readily be devised in accordance with these principles by those skilled in the art without departing from the scope and spirit of the invention.

What is claimed is:

1. A center-line filter apparatus for filtering out all but a single line at center line $f_c$ of the frequency spectrum of a pulsed RF signal characterized by a pulse repetition frequency (PRF), comprising:

a baseband analog filter having a noise bandwidth characteristic matched to the PRF for filtering the pulsed signal to provide an analog filter signal, said filter having an analog filter passband;

analog-to-digital convertor responsive to the analog filter signal for converting the analog filter signal to a digital convertor signal, the convertor sampling the analog filter signal at a high sampling rate in comparison to the PRF, said sampling rate determining potential aliasing frequencies, said sampling rate is high enough to position said potential aliasing frequencies outside said analog filter passband, wherein said analog filter rejects all potential aliasing frequencies at said sampling rate;

a digital filter for processing the digital convertor signals, the digital filter including weighting means for applying complex weights to the digital convertor signals, said digital filter providing a sharp cutoff filter which eliminates all unwanted spectral lines; and wherein the analog filter and digital filter act in combination to provide a filter having a composite filter response characteristic which provides a narrow passband at $f_c$ and which rejects all spectral lines except the spectral line at $f_c$.

2. The filter apparatus of claim 1 further comprising a decimation processor for decimating the output of the digital filter by a predetermined factor.

3. The filter apparatus of claim 2 wherein the digital convertor samples the analog filter signal at a rate equal to n times the PRF, and wherein the predetermined factor is equal to n.

4. The filter apparatus of claim 1 wherein the digital filter is a Finite Impulse Response (FIR) digital filter.

5. The filter apparatus of claim 1 wherein the digital convertor samples the analog filter signal at a rate equal to n times the PRF.

6. The filter apparatus of claim 5 wherein n is 30.

7. The filter apparatus of claim 1 wherein the composite filter response is non-symmetrical about zero frequency.

8. The filter apparatus of claim 1 wherein the analog filter is a low pass filter.

9. A radar receiver responsive to received pulsed RF signals characterized by a pulse repetition frequency (PRF), comprising:

an analog section and a digital section;

the analog section including an analog center line filter having a noise bandwidth characteristic matched to the PRF for filtering the pulsed signal to provide an analog filter signal;

the digital section including an analog-to-digital convertor and a digital filter;

the analog-to-digital convertor responsive to the analog filter signal for converting the analog filter signal to a digital convertor signal, the convertor sampling the analog filter signal at a high sampling rate in comparison to the PRF, said sampling rate determining potential aliasing frequencies, said sampling rate is high enough to position said potential aliasing frequencies outside said analog filter passband, wherein said analog filter rejects all potential aliasing frequencies at said sampling rate;

the digital filter for processing the digital convertor signals, the digital filter including weighting means for applying complex weights to the digital convertor signals, said digital filter providing a sharp cutoff filter which eliminates all unwanted spectral lines; and wherein the analog filter and digital filter act in combination to provide a center-line filter having a composite filter response characteristic which provides a narrow passband at $f_c$ and which rejects all spectral lines except the spectral line at center line $f_c$.

10. The receiver of claim 9 wherein the digital section further comprising a decimation processor for decimating the output of the digital filter by a predetermined factor.

11. The receiver of claim 10 wherein the digital convertor samples the analog filter signal at a rate equal to n times the PRF, and wherein the predetermined factor is equal to n.

12. The receiver of claim 9 wherein the digital filter is a Finite Impulse Response (FIR) digital filter.

13. The receiver of claim 9 wherein the digital convertor samples the analog filter signal at a rate equal to n times the PRF.

14. The receiver of claim 13 wherein n is 30.

15. The receiver of claim 9 wherein the composite filter response is non-symmetrical about zero frequency.

16. The receiver of claim 9 wherein the analog filter has an analog filter passband.

17. The receiver of claim 16 wherein the sampling frequency is a harmonic of the PRF.

18. A radar receiver responsive to received pulsed RF signals characterized by a pulse repetition frequency (PRF), comprising:

an analog section and a digital section;

the analog section including an analog base band center line filter having a noise bandwidth characteristic matched to the PRF for filtering the pulsed signal to provide an analog filter signal;

the digital section including an analog-to-digital convertor and a digital filter;

the analog-to-digital convertor responsive to the analog filter signal for converting the analog filter signal to a digital convertor signal, the convertor sampling the analog filter signal at a high rate in comparison to the PRF;

the digital filter for processing the digital convertor signals, the digital filter including weighting means for applying complex weights to the digital convertor signals, said digital filter providing a sharp cutoff filter which eliminates all unwanted spectral lines;

wherein the analog filter and digital filter act in combination to provide a center-line filter having a composite filter response characteristic which provides a narrow passband at $f_c$ and which rejects all spectral lines except the spectral line at center line $f_c$; and wherein the analog filter has an analog filter passband, the sampling rate of the analog-to-digital filter determines potential aliasing frequencies, and the sampling rate is high enough to position the potential aliasing frequen cies outside the analog filter passband, wherein the analog filter rejects all potential aliasing frequencies at the sampling rate of the analog-to-digital filter.

19. The receiver of claim 18 wherein the digital section further comprising a decimation processor for decimating the output of the digital filter by a predetermined factor.

* * * * *